(12) United States Patent
Takeuchi et al.

(10) Patent No.: US 7,491,976 B2
(45) Date of Patent: Feb. 17, 2009

(54) LIGHT-EMITTING ELEMENT ARRAY AND IMAGE FORMING APPARATUS

(75) Inventors: Tetsuya Takeuchi, Yokohama (JP); Makoto Koto, San Jose (JP); Kenji Yamagata, Sagamihara (JP); Yoshinobu Sekiguchi, Machida (JP); Takao Yonehara, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/782,935

(22) Filed: Jul. 25, 2007

(65) Prior Publication Data

US 2007/0262333 A1    Nov. 15, 2007

(30) Foreign Application Priority Data

Aug. 11, 2006    (JP)  ............................. 2006-219791

(51) Int. Cl.
    *H01L 33/00* (2006.01)
(52) U.S. Cl. .................... 257/93; 257/88; 257/E33.068
(58) Field of Classification Search ................... 257/88, 257/93
    See application file for complete search history.

(56) References Cited

U.S. PATENT DOCUMENTS

| 5,126,762 A |   | 6/1992  | Takeuchi et al. ......... 346/135.1 |
| 5,151,313 A |   | 9/1992  | Takeuchi et al. ............. 428/192 |
| 5,955,747 A | * | 9/1999  | Ogihara et al. ................. 257/88 |
| 6,190,935 B1 |   | 2/2001  | Ogihara et al. ................. 438/34 |
| 6,504,180 B1 | * | 1/2003  | Heremans et al. ............. 257/98 |
| 6,563,138 B2 |   | 5/2003  | Ogihara et al. ................. 257/88 |
| 6,621,105 B2 | * | 9/2003  | Taninaka et al. ............... 257/88 |
| 6,853,396 B1 |   | 2/2005  | Omae .......................... 347/237 |
| 7,135,708 B2 | * | 11/2006 | Ogihara et al. ................. 257/81 |

FOREIGN PATENT DOCUMENTS

| JP | 3185049      | 5/2001  |
| JP | 2001-307506  | 11/2001 |
| JP | 3340626      | 8/2002  |
| JP | 2005-197296  | 7/2005  |
| JP | 2007-081332  | 3/2007  |

OTHER PUBLICATIONS

M. Konagai et al., "High Efficiency GaAs Thin Film Solar Cells by Peeled Film Technology," The Journal of Crystal Growth, vol. 45, Dec. 1978, pp. 277-280.

* cited by examiner

*Primary Examiner*—Jerome Jackson, Jr.
(74) *Attorney, Agent, or Firm*—Fitzpatrick, Cella, Harper & Scinto

(57) ABSTRACT

A light-emitting element array can be manufactured without the separation of a metal reflection layer. The light-emitting element array includes a plurality of light-emitting element portions provided on a substrate, at least one space of the spaces between adjacent light-emitting element portions being electrically separated from each other, wherein the metal reflection layer is provided on the substrate and under the plurality of light-emitting element portions, and a resistive layer for electrical separation between the light-emitting element portions is provided between the plurality of light-emitting element portions and the metal reflection layer. The plurality of light-emitting element portions are divided into a plurality of blocks. Each of the blocks includes a plurality of light-emitting portions. The electrical separation between the light-emitting portions can be made as electrical separation between adjacent light-emitting element portions in adjacent and different blocks.

26 Claims, 14 Drawing Sheets

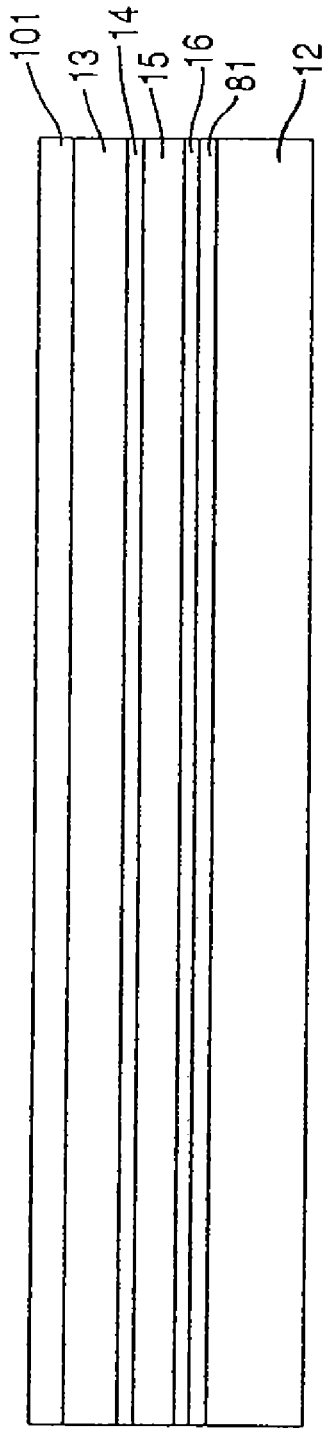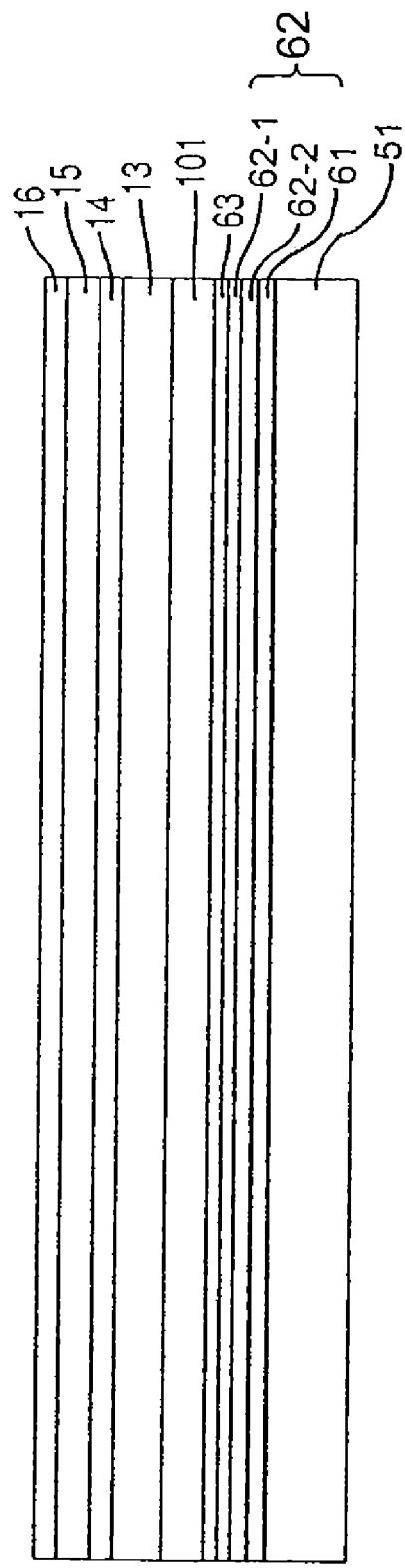

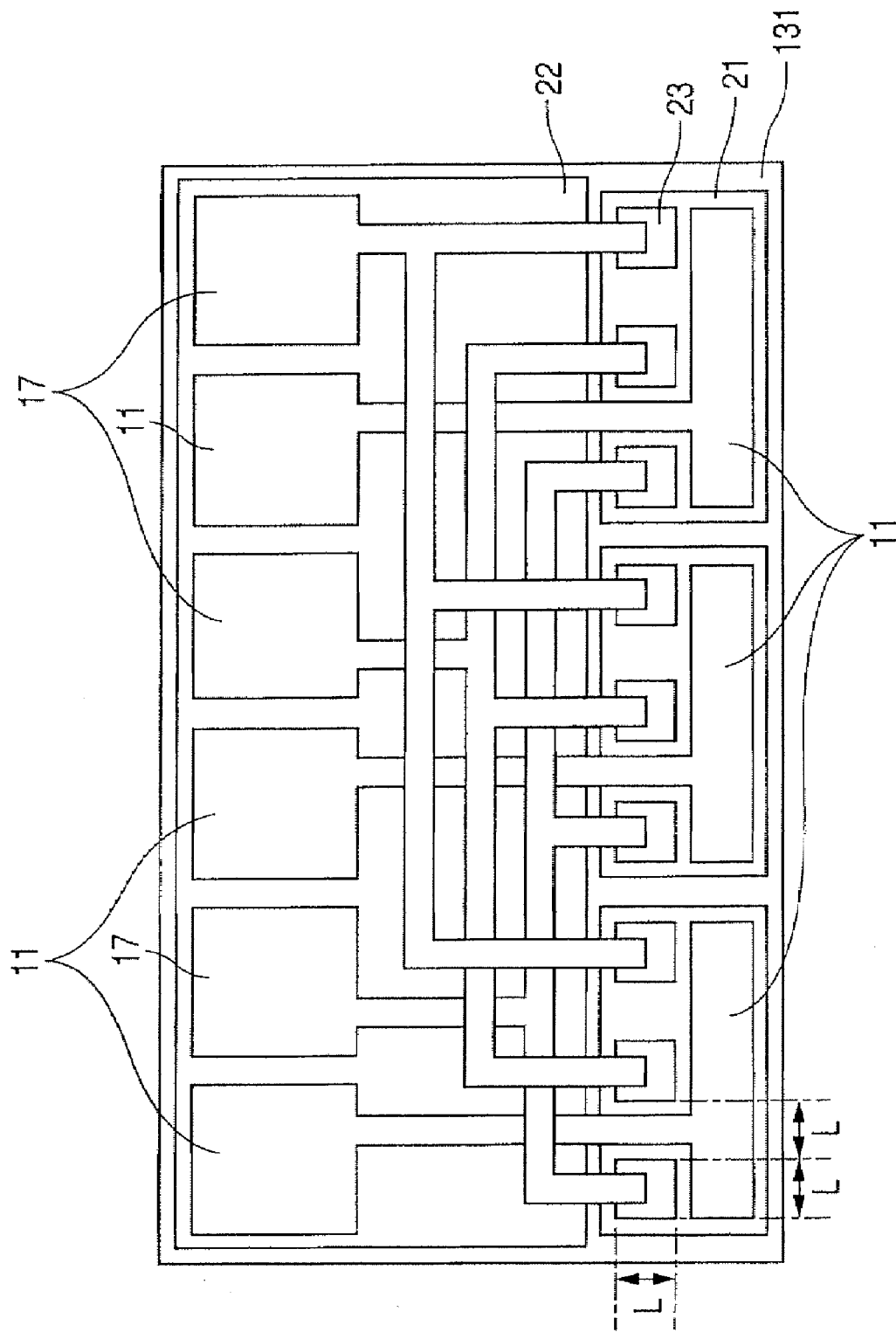

PRIOR ART

LIGHT-EMITTING ELEMENT ARRAY AND IMAGE FORMING APPARATUS

BACKGROUND OF THE INVENTION

1. Field of the Invention

The present invention relates to a light-emitting element array and an image forming apparatus, and specifically to a light-emitting element array which has a high light output intensity and operates with time division driving, and an image forming apparatus using the light-emitting element array.

2. Description of the Related Art

A light-emitting element array in which several thousand light-emitting diodes are arranged is used for an exposure light source of an electrophotographic printer. For example, the array is produced by forming an element structure each including several AlGaAs layers on a compound semiconductor substrate made of GaAs or the like and forming it to an array state (Japanese Patent No. 3185049).

When the light-emitting element array is used for a printer, it is necessary to determine an element size and an element interval according to desirable printing resolution. For example, in a case of 600 dpi, it is necessary to reduce the element size to at least a square of 40 μm or less and reduce the element interval to approximately 40 μm. In a case of 1200 dpi, half of each of the element size and the element interval is required. When the light-emitting element array is used as a printer light source, it is necessary to separately drive the light-emitting elements. In actuality, a time division driving method is used as a driving method to reduce the necessary number of electrodes for light emitting elements, the necessary number of driver IC chips, and the necessary number of wires for wire bonding, thereby suppressing an increase in cost (Japanese Patent No. 3340626).

A metal reflection layer is provided under a light-emitting element portion to improve extraction efficiency, thereby increasing light output intensity (Japanese Patent Application Laid-Open No. 2005-197296). When the light output intensity becomes higher, high-speed printing can be performed. Also, the light output intensity reaches a desirable intensity at a small current value, so that it is possible to realize a high-definition printer light source having small adverse effects caused by heat generation, such as poor device characteristics, poor device lifetime, or larger deviation of light emitting area.

Up to now, when the metal reflection layer is provided under the light-emitting element portion, light traveling to a substrate side can be reflected on the metal reflection layer and can be extracted from an element surface, thereby increasing the light output intensity. Usually a metal layer has a high conductivity, so that a method of easily performing current injection in a vertical direction by actively using the conductivity of the metal layer is used.

When a plurality of light-emitting elements are arranged to produce an array, for example, a method of forming a single n-side electrode as a common electrode and forming p-side electrodes corresponding to all the light-emitting elements to drive the light-emitting elements is considered. This is a fundamental driving method which is normally called a static driving method. However, for example, when a resolution of 1200 dpi is to be realized in a case of an A4 size, the number of elements is ten thousand or more, and an element density becomes very high. Therefore, there is no space for separately placing the p-side electrodes, thereby resulting in a problem that it is difficult to perform wire bonding for connection with driver IC chips.

Even in the case of the resolution of approximately 600 dpi, 5000 or more elements are required to realize the A4-size and thus 5000 or more driver IC chips and 5000 or more wires for wire bonding are required. Therefore, a method of reducing these numbers is desired for a reduction in cost.

In order to solve the above problems, time division driving is employed. This is also called dynamic driving. According to this driving, although the light-emitting elements are driven in time division, the number of electrodes necessary to drive all the elements can be reduced. In this case, electrode wiring is matrix wiring. In the matrix wiring, not a single common electrode is provided, but a plurality of common electrodes (for example, n-side electrodes) are formed, provided that each of common electrodes is formed per block including a plurality of light-emitting elements. On the other hand, it is unnecessary to independently place an electrode having the other conductive type (for example, p-side electrodes) for all the elements. When the number of p-side electrodes to be provided is equal to the number of all the elements included in the block in which the common electrode is formed, all the elements can be fundamentally driven. In this case, a p-side electrode is connected with not only one element in one block but also other elements included in other blocks which are different from the one block. That is, the plurality of elements are driven by using one p-side electrode.

FIG. 11 is an explanatory diagram illustrating time division driving. Light-emitting elements (light-emitting element portions) L1 to L9 are divided into three blocks. A first block includes three light-emitting elements L1 to L3, a second block includes three light-emitting elements L4 to L6, and a third block includes three light-emitting elements L7 to L9. N-side electrodes 11-1, 11-2 and 11-3 are provided for the light-emitting elements included in the respective blocks. P-side electrodes 17-1, 17-2 and 17-3 are provided for the light-emitting elements located at the same arrangement position in each of the blocks. In the first block including the light-emitting elements L1 to L3, while the n-side electrode 11-1 is selected by a switch and maintained at a ground (GND) potential, one of the p-side electrodes from 17-1 to 17-3 is selected by the other switch to supply a current to a target light-emitting elements from which light is to be emitted. Similarly, in the second block including the light-emitting elements L4 to L6, while the n-side electrode 11-2 is selected, one of the p-side electrodes from 17-1 to 17-3 is selected by the other switch. Similarly, in the third block including the light-emitting elements L7 to L9, while the n-side electrode 11-3 is selected, one of the p-side electrodes from 17-1 to 17-3 is selected by the other switch. The time division driving is performed by the above-mentioned operation.

Hereinafter, the structural examples of a light-emitting element array using AlGaAs for static driving and time division driving will be described. FIGS. 12 and 13 are a cross sectional view and a plan view, respectively, which illustrate a light-emitting element array capable of performing static driving. In this example, nine light-emitting elements (light-emitting element portions) in total are provided. Nine separate p-side electrodes 17 and one common n-side electrode 11, that is, ten electrodes in total are required. In FIGS. 12 and 13, an n-type AlGaAs layer 13, AlGaAs quantum well active layers 14, p-type AlGaAs layers 15, p-type GaAs contact layers 16, and the p-side electrodes 17 are formed on an n-type GaAs substrate 12. For element separation, separation grooves (element separation grooves) 18 are formed so as to reach the n-type AlGaAs layer 13. In a region 21, an insulating film 19 is formed on a portion of the n-type AlGaAs layer 13 exposed by etching for electrical insulation. In a region 22, a portion of the insulating film 19 is formed on the p-type GaAs contact layers 16 left without being etched. In each of light-emitting regions 23, a portion of the p-side electrode 17 is in direct contact with an upper surface of the p-type GaAs contact layer 16. When a current is injected from the p-side electrode, light is emitted from the region 23. The insulating film 19 is provided in the regions 21 and 22 and not provided in the regions 23, so that a current can be injected to only a necessary light-emitting region 23 through a corresponding p-side electrode 17. Each of the separation grooves 18 is provided to electrically separate adjacent light-emitting elements from each other.

FIGS. 14 and 15 are a cross sectional view and a plan view, respectively, which illustrate a light-emitting element array capable of performing time division driving. The same constituent members as the members illustrated in FIGS. 12 and 13 are indicated by the same reference numerals. In the ⅓-time division driving as illustrated in FIGS. 14 and 15, a matrix wiring of 3×3 is employed as described with reference to FIG. 11, all pixels can be driven by three common n-side electrodes and three common p-side electrodes, that is, six electrodes in total.

According to this method, when the number of time division is increased, the number of electrodes can be significantly reduced. However, unlike the static driving, it is necessary to form a plurality of common electrodes. In a normal case, a semi-insulating substrate 31 is used and separation grooves 32 which reach at least the surface of the substrate 31 are formed, so that the plurality of common electrodes can be relatively easily formed. The separation grooves 32 are provided to electrically isolate the light-emitting elements from one another for each block. As described above, in the case of the light-emitting element array using the metal reflection layer, an increase in light emission intensity is expected by the metal reflection layer. When the electrical isolation for each block is required for time division driving, the conductivity of the metal reflection layer becomes a problem for the purpose. Therefore, as illustrated in FIG. 16, it is necessary to form the separation grooves which reach not only a semiconductor layer but also a metal reflection layer 52. In the case of the separation of only the semiconductor layer, an etching process is performed one time. However, in the case of the separation of the metal reflection layer, a different etching process is normally further necessary, with the result that there is a problem that an increase in cost and a reduction in yield occur.

SUMMARY OF THE INVENTION

The present invention has been made to solve the above-mentioned problem. An object of the present invention is to provide a light-emitting element array which is particularly high in light output intensity and can operate with time division driving at low cost.

According to the present invention, a light-emitting element array includes: a substrate; a plurality of light-emitting elements provided on the substrate, at least one space of spaces between adjacent light-emitting elements being electrically separated; a metal reflection layer provided on the substrate and under the plurality of light-emitting elements; and a resistive layer provided between the plurality of light-emitting elements and the metal reflection layer, for electrical separation of the space between the light-emitting elements.

Further, the present invention provides an array light source including: a substrate; a metal reflection layer; a plurality of light-emitting elements provided on the substrate through the metal reflection layer; and a resistive layer provided between the metal reflection layer and the light-emitting elements to electrically separate the metal reflection layer from the light-emitting elements.

Further, the present invention provides an array light source, including: a substrate; a common metal reflection layer; a first light-emitting element group and a second light-emitting element group each including a plurality of light-emitting elements, the first and second light-emitting element groups being provided on the substrate through the common metal reflection layer; a separation layer provided between the first and second light-emitting element groups and the metal reflection layer, for electrical separation between the metal reflection layer and the first and second light-emitting element groups; and a separation groove provided between the first light-emitting element group and the second light-emitting element group, for electrical separation between the first light-emitting element group and the second light-emitting element group, wherein the separation groove is provided such that the separation groove reaches the separation layer in a direction from a light-emitting element side toward a substrate side.

According to the present invention, the resistive layer is provided below the plurality of light-emitting element portions and on the metal reflection layer. Therefore, the light-emitting element array can be manufactured without the separation of the metal reflection layer, an array forming process can be significantly simplified, and a manufacturing cost can be reduced. An array which operates with time division driving can be manufactured by a simple process. This has a high effect on an array which realizes a resolution equal to or larger than 600 dpi.

Further features of the present invention will become apparent from the following description of exemplary embodiments with reference to the attached drawings.

BRIEF DESCRIPTION OF THE DRAWINGS

FIG. 6 is an explanatory cross sectional view illustrating a step of producing an element array in the second embodiment of the present invention.

FIG. 7 is an explanatory cross sectional view illustrating a step of producing an element array in the second embodiment of the present invention.

FIG. 8 is a plan view illustrating the light-emitting element array according to the second embodiment of the present invention.

DESCRIPTION OF THE EMBODIMENTS

Hereinafter, embodiments of the present invention will be described with reference to the attached drawings.

First Embodiment

A light-emitting element array according to a first embodiment of the present invention includes a metal reflection layer provided between a substrate and a plurality of light-emitting elements and used common (electrodes?) to the plurality of light-emitting elements. The light-emitting element array further includes a resistive layer for electrical separation between the light-emitting elements, provided between the plurality of light-emitting elements and the metal reflection layer. According to this structure, the elements can be separated from one another without providing grooves for element separation in the metal reflection layer itself. The present invention does not exclude a case where grooves are provided in the metal reflection layer if necessary.

Hereinafter, the first embodiment of the present invention will be specifically described with reference to FIG. 1 and the like.

Figure 1:
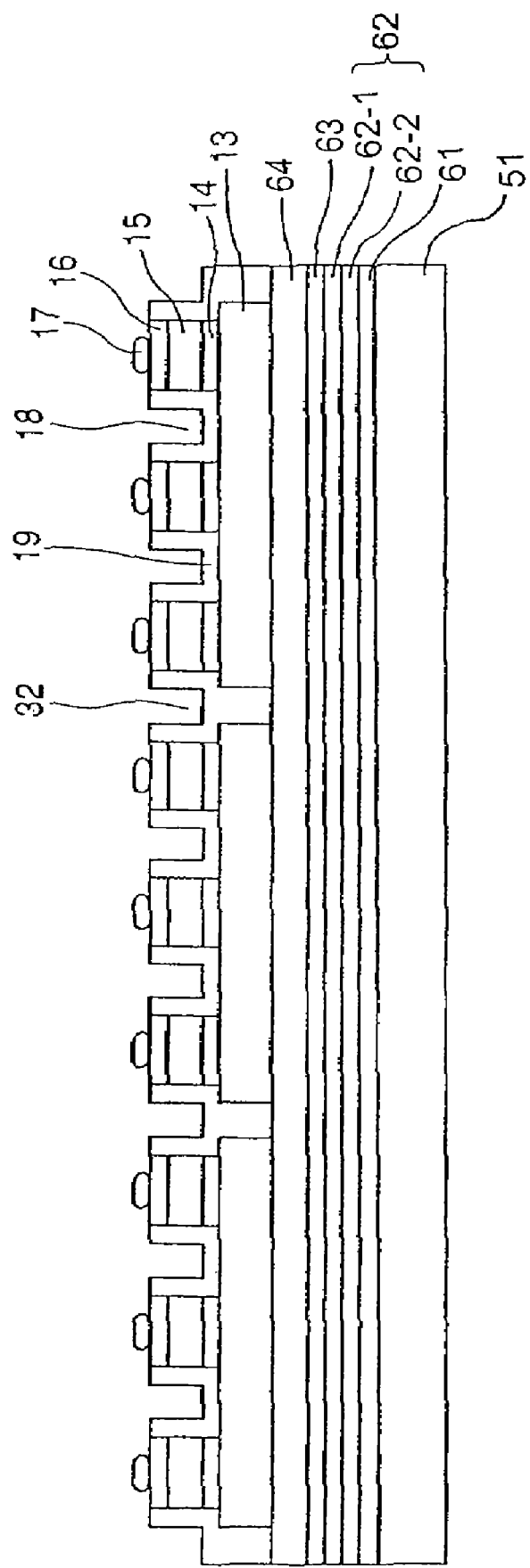
FIG. 1 is a cross sectional view illustrating a light-emitting element array according to a first embodiment of the present invention.

FIG. 1 is a cross sectional view illustrating the light-emitting element array according to the first embodiment of the present invention. As illustrated in FIG. 1, a platinum layer 61, a gold layer 62, a silver layer 63, and an undoped AlGaAs resistive layer (layer for electrically separating metal layers from first and second light-emitting element groups) 64 are formed on an Si substrate 51. N-type AlGaAs layers 13, AlGaAs quantum well active layers 14, p-type AlGaAs layers 15, p-type GaAs contact layers 16, and the p-side electrodes 17 are formed further on the undoped AlGaAs resistive layer 64. An insulating film 19 is provided. For element separation, first separation grooves (element separation grooves) 18 are formed so as to reach the n-type AlGaAs layers 13. For n-side common electrode separation, second separation grooves (n-side electrode separation grooves) 32 are formed so as to reach the undoped AlGaAs resistive layer 64. The second separation grooves 32 are used to set a sufficient resistance between n-side electrodes, thereby separating the n-side electrodes from one another. The second separation grooves reach at least the undoped AlGaAs resistance layer 64. The separation grooves 32 may reach the silver layer 63 serving as the metal reflection layer. Each of the separation grooves 18 is provided to electrically separate adjacent light-emitting elements from each other. The separation grooves 32 are provided to electrically separate blocks each including the light-emitting elements. Each of the separation grooves 32 is a separation groove for electrically separating a first light-emitting element group (a plurality of light-emitting elements included in a block) from a second light-emitting element group (a plurality of light-emitting elements included in another block). In FIG. 1, for simplification, the n-side electrodes are not illustrated (illustrated as n-side electrodes 11 in FIG. 2).

FIG. 1 illustrates an example in which the metal reflection layer includes the Pt layer, the Au layer, and the Ag layer which are arranged in order from the side of the substrate 51. However, the present invention is not limited to the example. For example, one of a single metal layer (such as an aluminum layer or a Ti layer) and an alloy layer can be used as the metal reflection layer. A TiN layer or an SiN layer may be provided on an upper surface and a lower surface of the metal layer or the alloy layer which serves as the reflecting layer. For example, a TiN/Al/TiN layer structure is employed.

In FIG. 1, a portion corresponding to the n-type AlGaAs layer can be replaced by a structure including a clad layer adjacent to an active layer and a semiconductor multiplayer reflecting mirror (DBR mirror).

An organic insulating film (for example, a positive photosensitive polyimide film) can be interposed between the undoped AlGaAs resistive layer 64 and the metal reflection layer (61, 62, 63).

An Si substrate in which a driver IC circuit for driving the light-emitting elements is incorporated can be used as the Si substrate 51. The driver IC circuit includes transistors located in an insulating region of the Si substrate. In order to connect the driver IC circuit with the light-emitting elements, the metal reflection layer is partially removed if necessary.

Figure 10A:
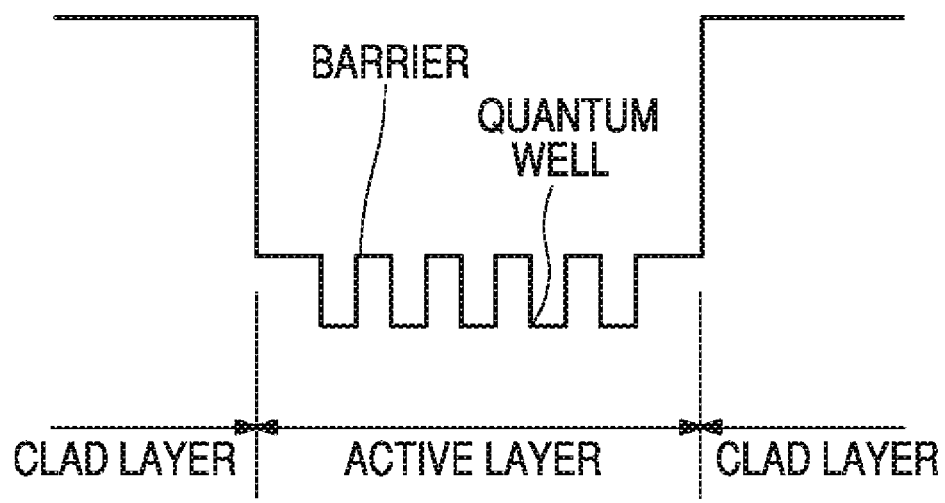
FIGS. 10A and 10B are potential diagrams for active layers.

In this embodiment, the active layer has a quantum well structure and a potential diagram thereof is illustrated in FIG. 10A. In FIG. 10A, a composition of each of the n-type AlGaAs layer (clad layer) 13 and the p-type AlGaAs layer (clad layer) 15 is, for example, $Al_{0.4}Ga_{0.6}As$ (AlGaAs is normally expressed by $Al_xGa_{1-x}As$ (0<x<1), where x=0.4). The AlGaAs quantum well active layer 14 has a composition, for example, $Al_{0.1}Ga_{0.9}As$ as a quantum well region and $Al_{0.25}Ga_{0.75}As$ as a barrier region. Examples of the active layer of the present invention include not only the quantum well active layer as described above but also an active layer having a single hetero structure and an active layer having a double hetero structure.

Figure 2:
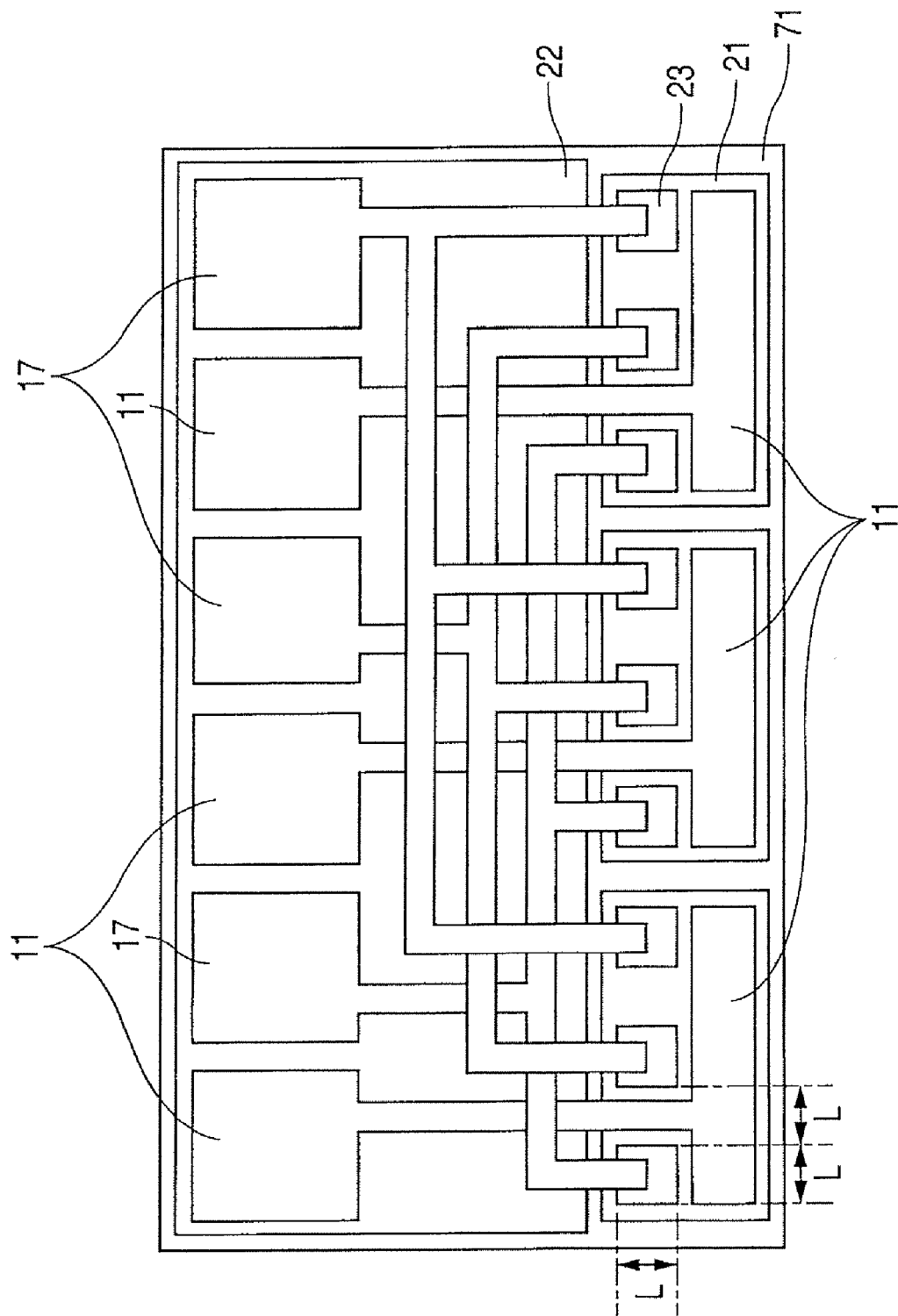
FIG. 2 is a plan view illustrating the light-emitting element array according to the first embodiment of the present invention.

FIG. 2 is a plan view illustrating the light-emitting element array according to the above embodiment. In this embodiment, the first separation grooves 18 are formed such that each of an element size and an element interval is 20 μm (L=20 μm in FIG. 2). Blocks are separated from one another by the second separation grooves 32 so as to include a plurality of (three in FIG. 2) light-emitting elements. One n-side electrode 11 per block is formed so as to cover the plurality of (three in FIG. 2) light-emitting elements. The first separation grooves 18 reach the N-type AlGaAs layers 13. The second separation grooves 32 reach at least the undoped AlGaAs resistive layer 64. The insulating film 19 is deposited in each of the first separation grooves 18 and the second separation grooves 32 to make electrical separation. The electrical separation is not necessarily made by the formation of the separation grooves. The electrical separation may be made by, for example, the selective formation of insulating regions. The electrical separation can be made by, for example, ion implantation.

The plurality of (three in FIG. 2) n-side electrodes 11 and the plurality of (three in FIG. 2) p-side electrodes 17 are formed in a multilayer wiring manner on the insulating film 19. Only a necessary portion of each of the n-side electrodes 11 is in direct contact with corresponding one of the n-type AlGaAs layers 13. Only a necessary portion of each of the p-side electrodes 17 is in direct contact with corresponding one of the p-type GaAs contact layers 16. A current can be injected to a desirable light-emitting element by the selection of a suitable combination of an n-side electrode and a p-side electrode. The remaining n-side and p-side electrodes are multilayer-wired through the insulating film, so that a current injection region does not expand carelessly. In addition, an electrode area sufficient to make electrical connection by wire bonding is provided.

As illustrated in FIG. 2, in each of regions 21, the insulating film 19 is formed on a portion of the n-type AlGaAs layer 13 exposed by etching for element separation. In a region 22, the insulating film 19 is formed on the p-type GaAs contact layers 16 left without being etched. In the region 22, although the insulating film 19 is formed on the remaining p-type GaAs contact layers 16, etching may alternatively be performed until the undoped AlGaAs resistive layer is exposed while the separation grooves 32 are formed, and then the insulating film 19 may be formed thereon.

In a region 71, the insulating film 19 is formed on the undoped AlGaAs resistive layer 64 exposed by etching for n-side electrode separation. In each of light-emitting regions 23, a portion of the p-side electrode 17 is in direct contact with an upper surface of the p-type GaAs contact layers 16. When a current is injected from the each of the p-side electrodes, light is emitted from corresponding one of the regions 23. The insulating film 19 is provided in the regions 21, 22, and 71 and not provided in the regions 23, so that a current can be injected to only a necessary light-emitting region 23 through a corresponding p-side electrode 17.

Next, element array manufacturing steps in this embodiment will be described.

Figure 3:
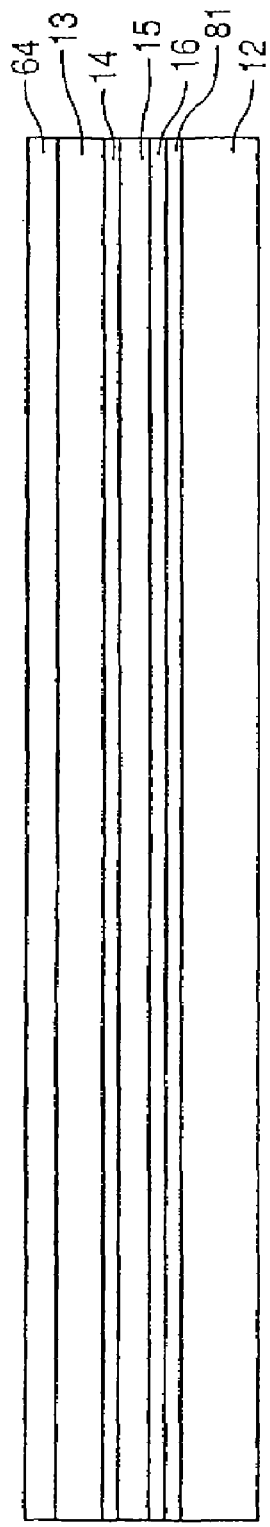
FIG. 3 is an explanatory cross sectional view illustrating a step of producing an element array in the first embodiment of the present invention.

As illustrated in FIG. 3, element constituent layers having a layer structure reversed to the layer structure of FIG. 1 (reverse element constituent layers) are formed on the Si-doped GaAs substrate 12 by epitaxial growth. A semi-insulating GaAs substrate is normally used for time division driving. However, the semi-insulating GaAs substrate has a high etch pit density. In addition, when a light-emitting element structure is grown on the semi-insulating GaAs substrate, there is a case where light-emitting characteristics are deteriorated by the influence thereof. In this embodiment, as described later, an element constituent portion provided on the Si-doped GaAs substrate 12 is separated from the Si-doped GaAs substrate 12 and transferred to an Si substrate. Therefore, a substrate can be used without depending on the conductivity thereof, and the Si-doped GaAs substrate 12 having a low etch pit density can be generally used.

The reverse element constituent layers are formed by forming an AlAs selective etching separation layer 81, the p-type GaAs layer 16, the p-type AlGaAs layer 15, the AlGaAs quantum well active layer 14, the n-type AlGaAs layer 13, and the undoped AlGaAs resistive layer 64 are formed on the Si-doped GaAs substrate 12 in this order. In this embodiment, the undoped AlGaAs resistive layer 64 is used as the resistive layer. Therefore, the resistive layer can be formed during the epitaxial growth of the element constituent layers. Further an uppermost surface is the AlGaAs layer, and when a high Al composition is used therefor, there is a case where the surface oxidation of the AlGaAs layer becomes a problem. In this case, a very thin (approximately 5 nm) GaAs layer can be grown as a cap layer on the uppermost surface.

After the epitaxial growth, a metal film is formed on each of the surface of a wafer and the surface of the Si substrate serving as a support substrate which is separately prepared. To be specific, the silver layer 63 and a gold layer 62-1 are successively formed on the Si-doped GaAs substrate 12 by a sputtering method and the platinum layer 61 and a gold layer 62-2 are successively formed on the Si substrate 51 by a sputtering method. Then, the surfaces of the gold layers 62-1 and 62-2 are bonded to each other. Because a gold material has high reflectance and gold materials are easily bonded to each other, the gold material is suitable for use in this embodiment. However, the adhesion of the gold material with a substrate is normally low. Therefore, in order to improve the adhesion, the platinum layer 61 is inserted on the Si substrate side which does not require high reflectance and the silver layer 63 is inserted on the GaAs substrate side which requires high reflectance. The gold layers 62-1 and 62-2 are bonded to each other to form the gold layer 62.

Figure 4:
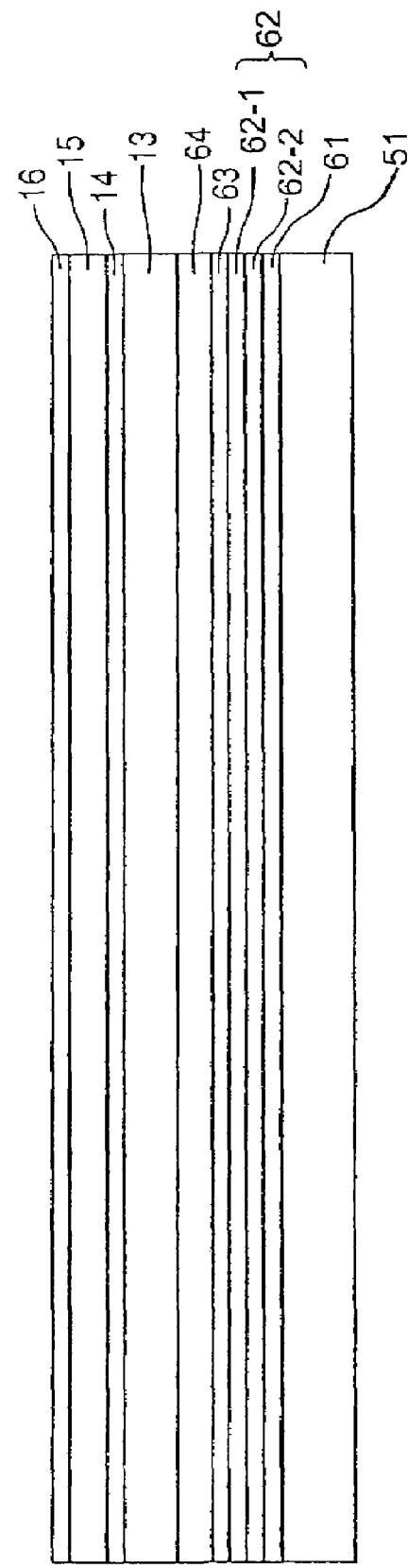
FIG. 4 is an explanatory cross sectional view illustrating a step of producing an element array in the first embodiment of the present invention.

Subsequently, the AlAs selective etching separation layer 81 is selectively etched by immersion in a hydrofluoric acid solution to separate the GaAs substrate from the Si substrate on which the element constituent layers are formed. That is, the element constituent layers (layers reversed to the reverse element constituent layers) are transferred from the GaAs substrate to the Si substrate (M. Konagai, M. Sugimoto, and T. Takahashi, J. Cryst. Growth 45, 277 (1978)). Thereby, a wafer including the metal reflection layer as illustrated in FIG. 4 is completed.

Subsequently, the wafer is patterned by a photolithography technique and separation grooves are formed therein by wet etching or dry etching. As illustrated in FIG. 2, each of the element size and element interval is set to 20 μm. Etching is performed from the surface and completed at the time when etching reaches the n-type AlGaAs layer 13, thereby forming the first separation grooves 18. Then, patterning is performed again for n-side contact formation and the n-type AlGaAs layer is exposed by etching. This step can be performed simultaneously with the formation of the first separation grooves. Patterning is further performed and the second separation grooves 32 are formed by etching. At least the separation grooves 32 reach the undoped AlGaAs resistive layer 64. The separation grooves 32 may reach the silver layer 63.

After that, the insulating film 19 is deposited. Contact holes are formed in the insulating film by pattering and etching thereon such that contact portions of the n-side electrodes and contact portions of the p-side electrodes are directly bonded to contact portions of the elements. Then, the formation of electrode wirings which is performed by lift-off and the deposition of the insulating film are repeated several times to form multilayer wirings including the n-side electrodes 11 and the p-side electrodes 17. Finally, a chip having a desirable shape is obtained by cutting and the production of an array chip is completed.

In order to drive a desirable element by time division driving, a resistance between adjacent n-side electrodes is made higher than a resistance between p-side and n-side electrodes. In other words, when the AlGaAs resistive layer has a resistance value higher than a resistance value of each of the p-type AlGaAs layer and the n-type AlGaAs layer, a current can be prevented from flowing into the metal layer included in the AlGaAs resistive layer. The resistance value of the AlGaAs resistive layer is preferably a value ten times or more the resistance value of each of the p-type AlGaAs layer and the n-type AlGaAs layer. The resistance value of the AlGaAs resistive layer is more preferably a value fifty times or more the resistance value of each of the p-type AlGaAs layer and the n-type AlGaAs layer.

A carrier density of the undoped AlGaAs resistance layer 64 is $1 \times 10^{16}$ cm$^{-3}$ or less. In order to obtain a sufficient resistance, a carrier concentration of the resistance layer, that is, a doping concentration thereof is desirably $1 \times 10^{17}$ cm$^{-3}$ or less in the case of p-type. In the case of n-type, the doping concentration is desirably $3 \times 10^{16}$ cm$^{-3}$ or less. Examples of a p-type dopant include C, Zn, Mg and Be, and examples of an n-type dopant includes Si, Ge, Te, Se and S.

A thickness of the resistive layer is 0.3 µm. When the resistive layer is too thin, carriers are diffused from the element structure side, so that an ineffective current flowing into the metal film increases. On the other hand, when the resistive layer is too thick, this causes an increase in production cost or the increase of light absorption. Therefore, there is an effective thickness range. A desirable thickness is set to 0.1 µm to 1 µm. A more desirable thickness is set to 0.2 µm to 0.5 µm.

In order to sufficiently obtain an effect that a light output intensity is increased by reflection on the metal film, it is important to minimize the amount of light absorbed by the AlGaAs resistive layer. Therefore, in order to prevent light having a light emission wavelength from being absorbed by the AlGaAs resistive layer, it is important to adjust an Al composition value of the AlGaAs resistance layer. To be specific, it is important to set the Al composition value of the AlGaAs resistive layer to a value sufficiently larger than an Al composition value of an active layer. For example, when an average Al composition value of the active layer is x %, a desirable Al composition value of the AlGaAs resistive layer is (x+10)% or more. In this embodiment, the average Al composition value of the active layer is 17.5%, so that the desirable Al composition value of the AlGaAs resistive layer is 27.5% or more.

Figure 10B:
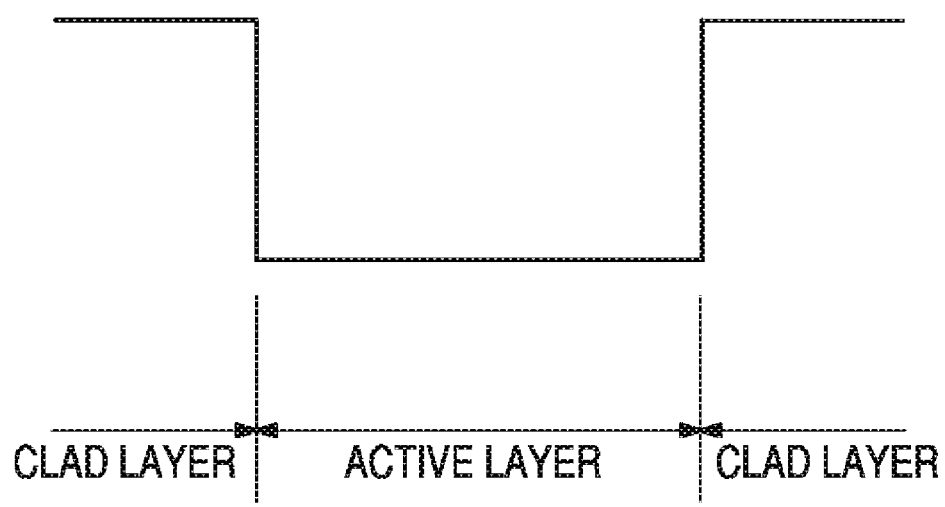
Figure 11:
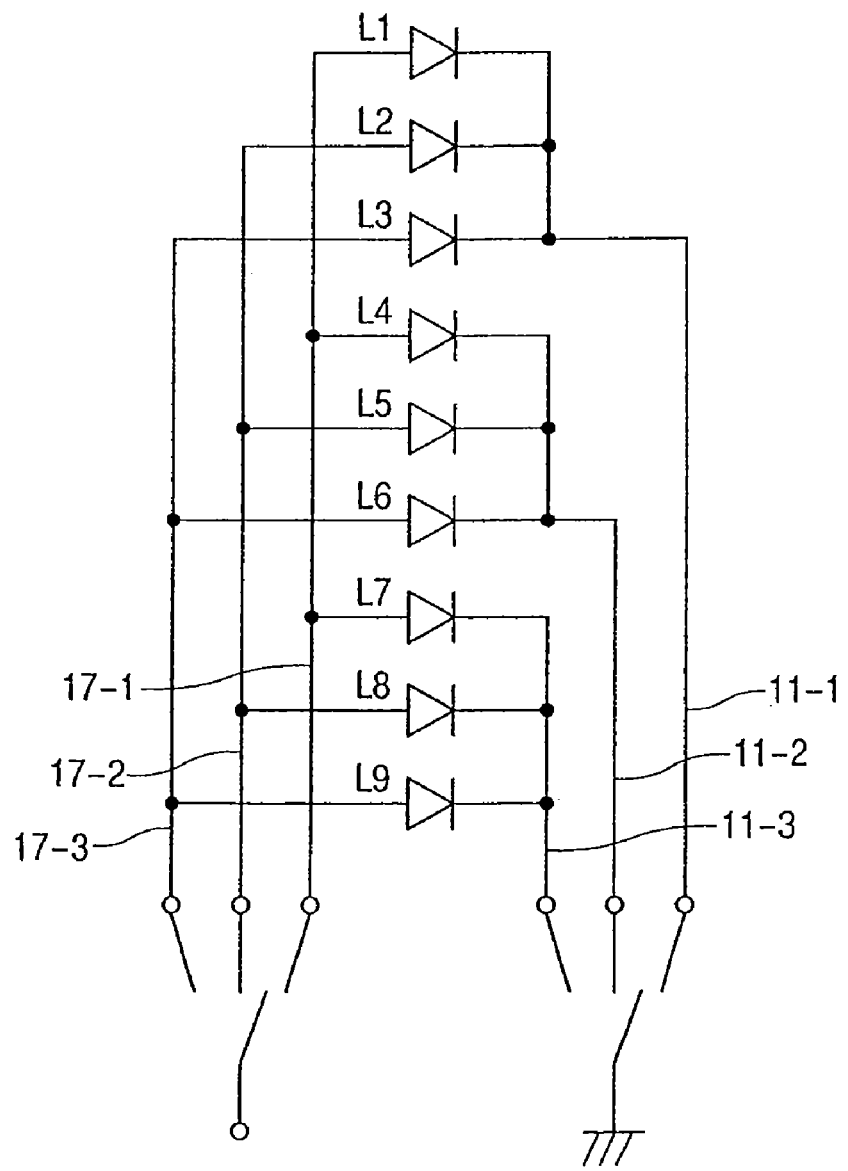
FIG. 11 is a diagram illustrating time division driving.
Figure 12:
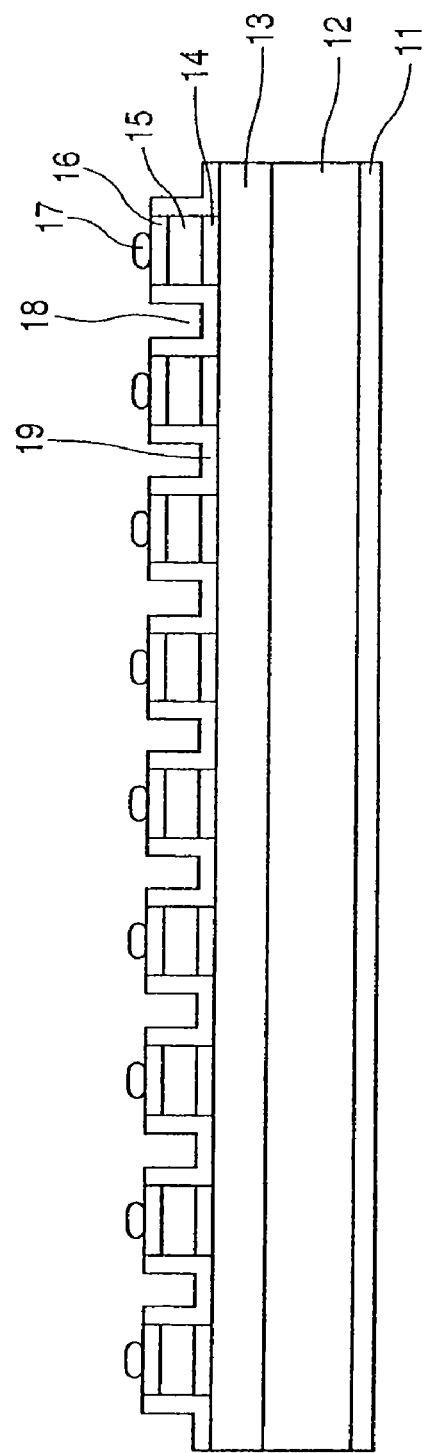
FIG. 12 is a cross sectional view illustrating a general light-emitting element array capable of performing static driving.
Figure 13:
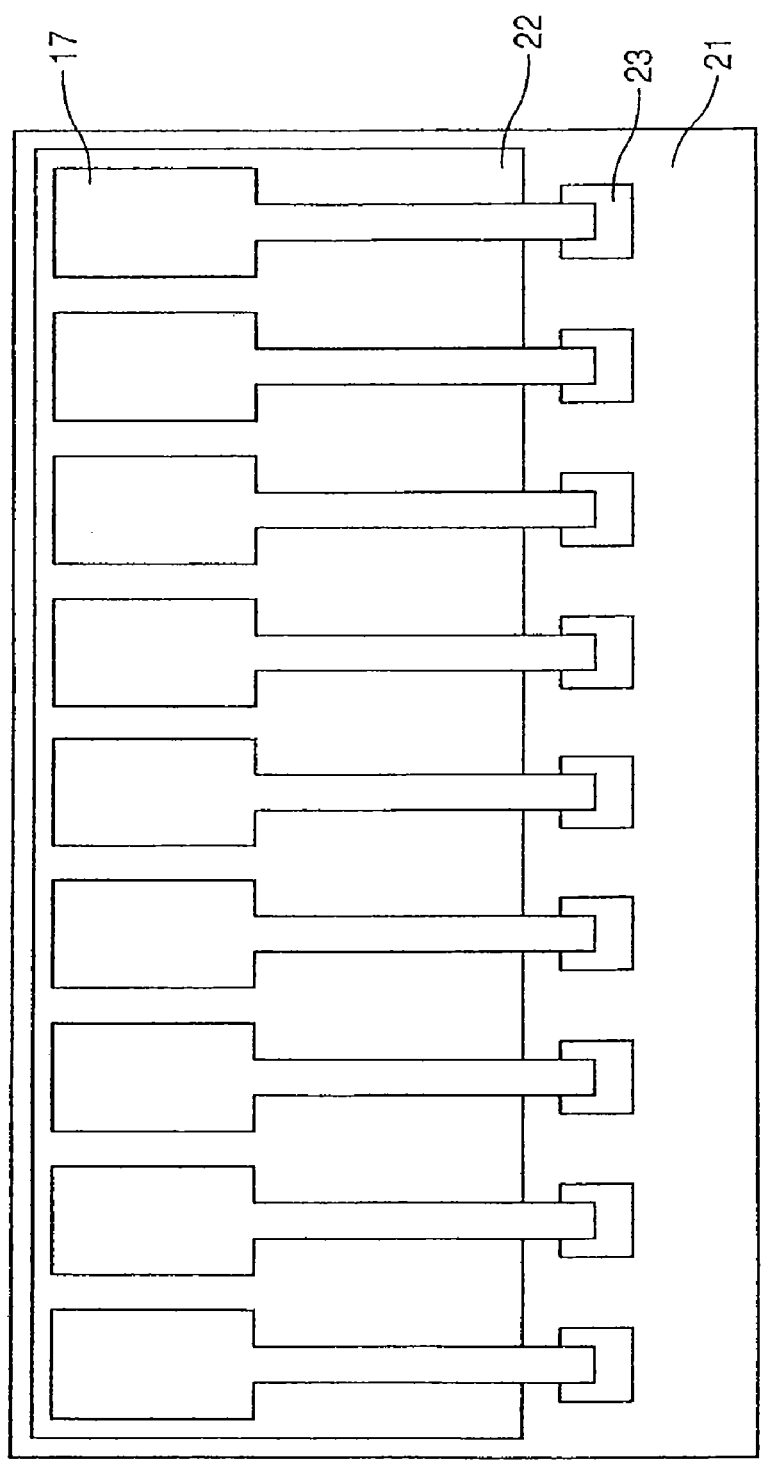
FIG. 13 is a plan view illustrating the general light-emitting element array capable of performing static driving.
Figure 14:
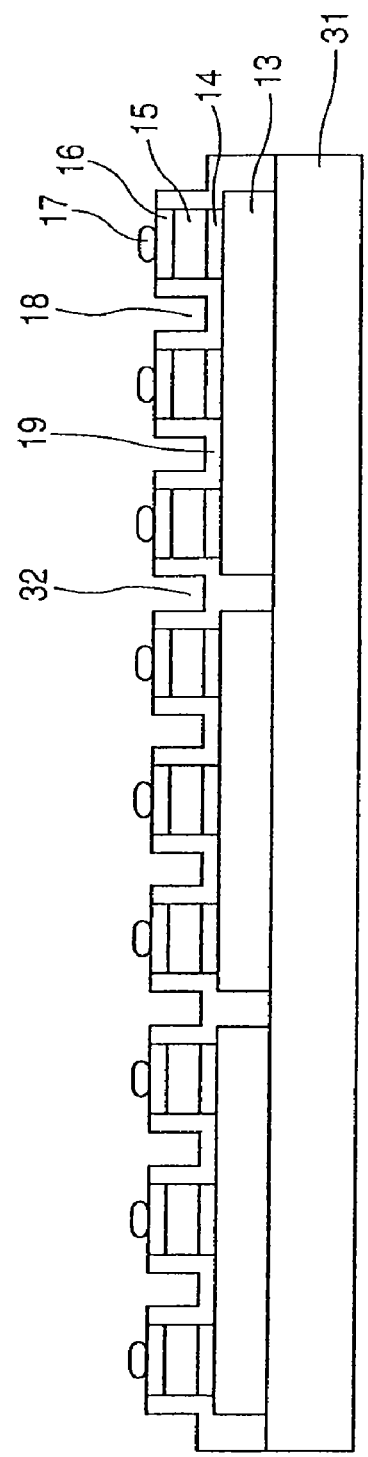
FIG. 14 is a cross sectional view illustrating a general light-emitting element array capable of performing time division driving.
Figure 15:
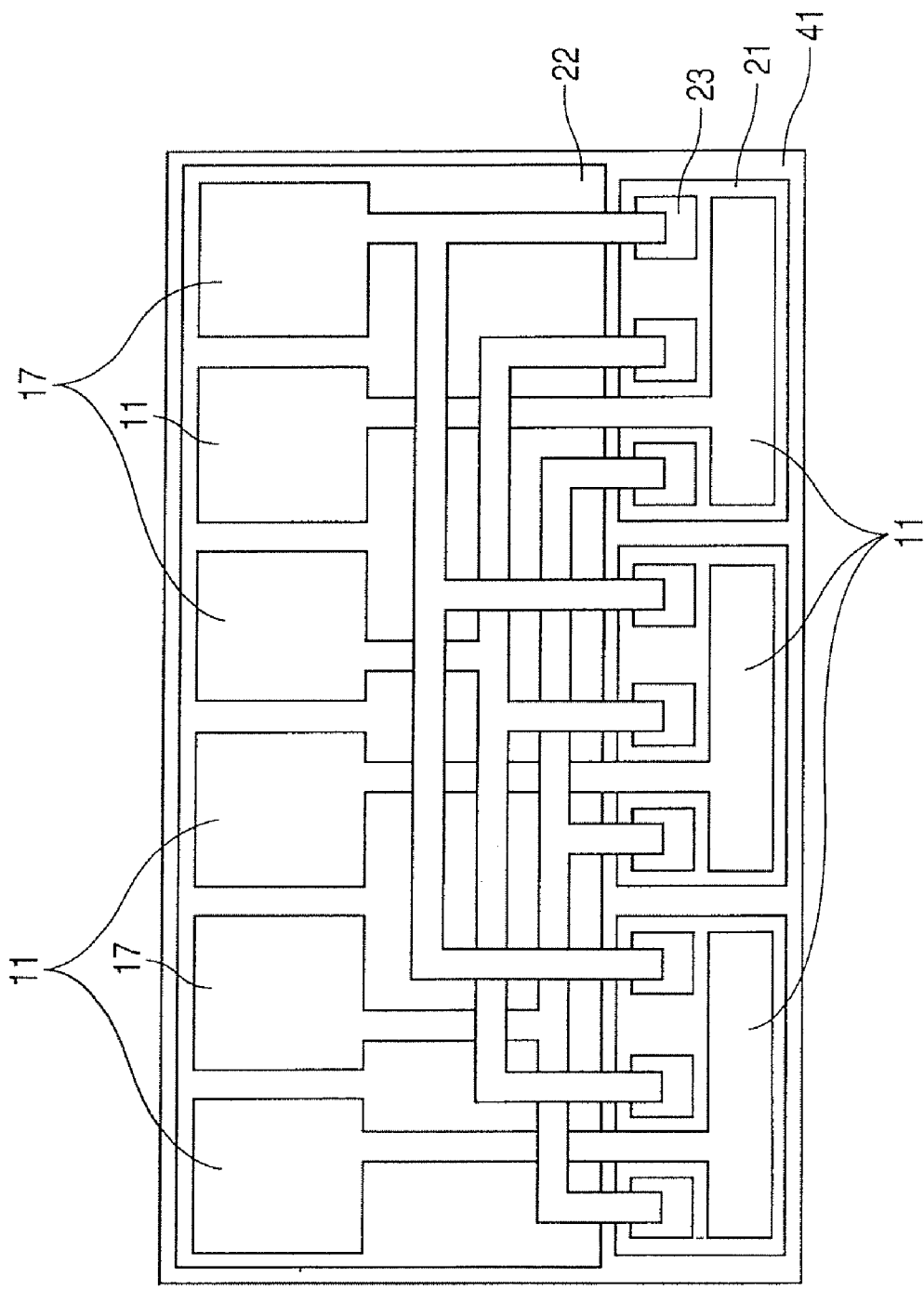
FIG. 15 is a plan view illustrating the general light-emitting element array capable of performing time division.
Figure 16:
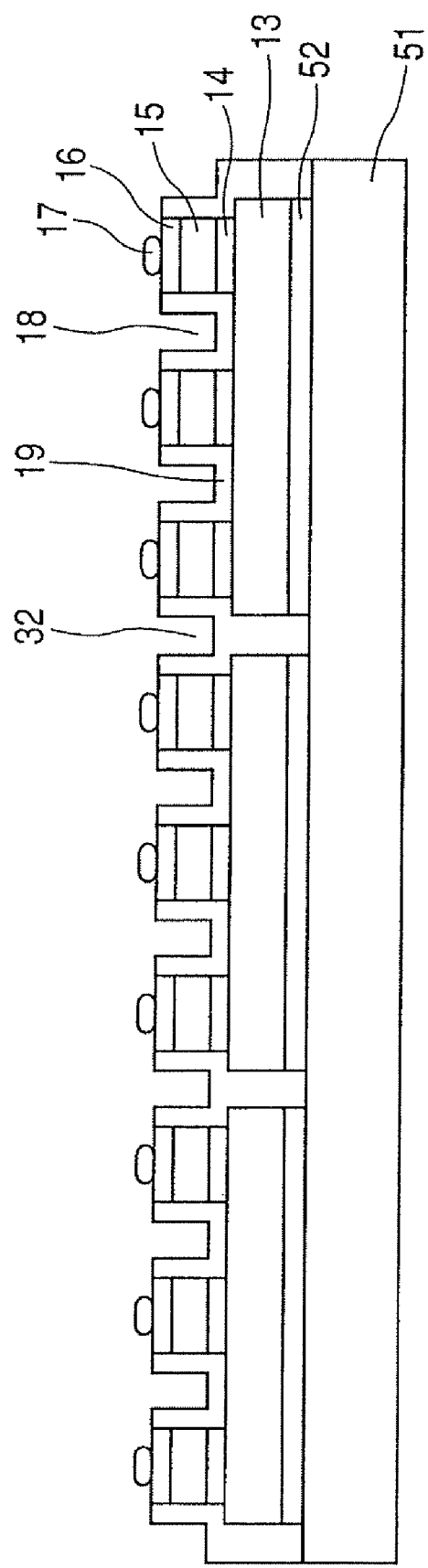
FIG. 16 is a cross sectional view illustrating a conventional light-emitting element array including a metal reflection mirror.

In this embodiment, the case where the active layer has the quantum well structure is described. The active layer may be an active layer having an AlGaAs double hetero structure. A potential diagram of a case where the active layer has the AlGaAs double hetero structure is illustrated in FIG. 10B. The AlGaAs layer serving as the active layer has, for example, a composition of $Al_{0.13}Ga_{0.87}As$ and a clad layer has, for example, a composition of $Al_{0.4}Ga_{0.6}As$. In this case, the active layer has a composition of $Al_{0.13}Ga_{0.87}As$ and thus the Al composition value thereof is 13%, so the desirable Al composition value of the AlGaAs resistive layer is 23% or more.

In addition to the case where the light-emitting element constituent layers located on the GaAs substrate are provided on the Si substrate by one-time bonding step, the light-emitting element constituent layers can be temporarily transferred to another support substrate and then transferred to the Si substrate. In this case, the reverse element constituent layers are not necessarily formed on the GaAs substrate. When the light-emitting element constituent layers are to be finally transferred onto the Si substrate, an organic insulating film can be interposed therebetween. In this case, the metal reflection layer (which is not necessarily formed as a multilayer film) is formed in advance the Si substrate side or the light-emitting element side.

Second Embodiment

Figure 5:
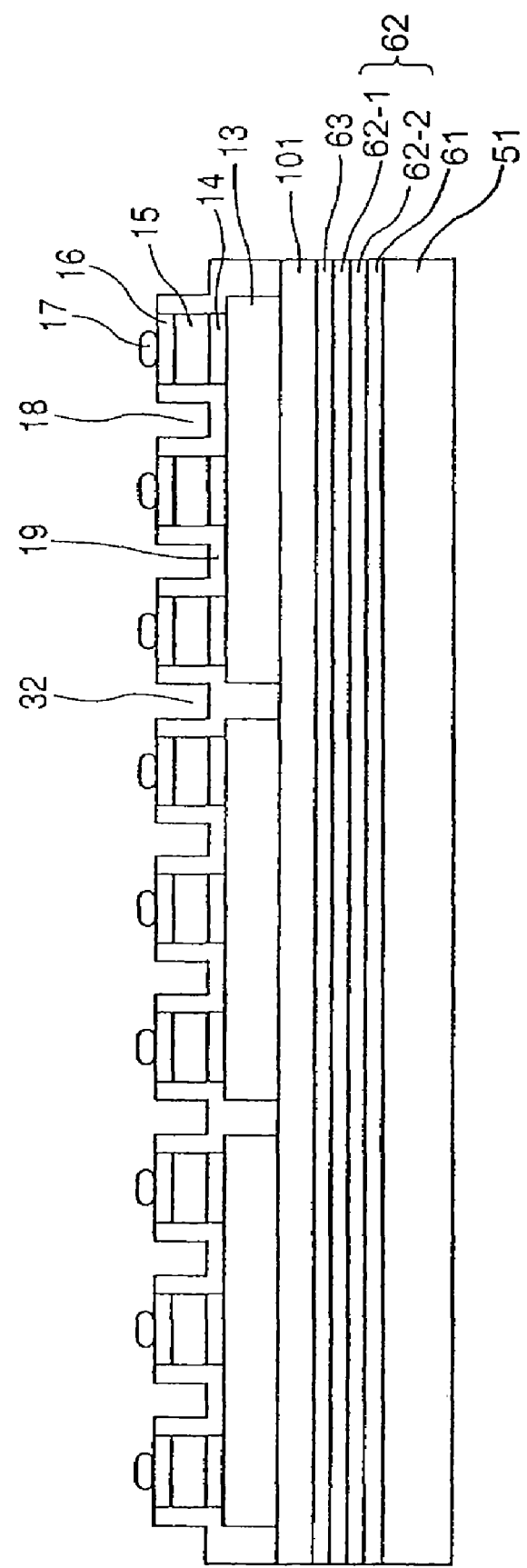
FIG. 5 is a cross sectional view illustrating a light-emitting element array according to a second embodiment of the present invention.

FIG. 5 is a cross sectional view illustrating a light-emitting element array according to a second embodiment of the present invention. This embodiment is different from the case of FIG. 1 in the point that an $SiO_2$ film 101 instead of the undoped AlGaAs resistance layer is located on the metal reflection layer (silver layer 63). The $SiO_2$ film is used as the resistive layer, so that higher-insulation separation can be made. The other constituent members are the same as those illustrated in FIG. 1.

Element array producing steps in this embodiment will be described. As illustrated in FIG. 6, element constituent layers having a layer structure reversed to the layer structure of FIG. 5 are formed on the GaAs substrate 12 by epitaxial growth. At this time, the AlAs selective etching separation layer 81 is located just under the reverse element constituent layers. The AlAs selective etching separation layer 81 is used, after selectively etching later, to separate the GaAs substrate 12 from the reverse element constituent layers. After the epitaxial growth of the reverse element constituent layers (p-type GaAs contact layer 16, p-type AlGaAs layer 15, AlGaAs quantum well active layer 14, and n-type AlGaAs layer 13), the $SiO_2$ film 101 is deposited on a growth surface at a thickness of 0.3 µm to form a resistive layer.

After that, a metal film is formed on each of the surface of a wafer and the surface of the Si substrate which is separately prepared. As in the case of the first embodiment, the silver layer 63 and the gold layer 62-1 are successively formed on the side of the GaAs substrate 12 by a sputtering method and the platinum layer 61 and the gold layer 62-2 are successively formed on the side of the Si substrate 51 by a sputtering method. Then, the surfaces of the gold layers 62-1 and 62-2 are bonded to each other. Then, only the AlAs selective etching separation layer 81 is selectively etched by immersion in a hydrofluoric acid solution to transfer the element constituent layers (layers reversed to the reverse element constituent layers) onto the Si substrate. Therefore, a wafer including the metal films and the $SiO_2$ film as illustrated in FIG. 7 is produced.

Subsequently, the wafer is patterned by a photolithography technique and separation grooves are formed therein by wet etching or dry etching. As illustrated in FIG. 8, each of the element size and element interval is set to 20 µm. Etching is performed from the surface and completed at the time when etching reaches the n-type AlGaAs layer 13, thereby forming the first separation grooves 18. Then, patterning is performed again for n-side contact formation and the n-type AlGaAs layer is exposed by etching. This step can be performed simultaneously with the formation of the first separation grooves as described above. Patterning is further performed and the second separation grooves 32 are formed by etching. At least the separation grooves reach the $SiO_2$ film 101. The separation grooves may reach the silver layer 63.

After that, the insulating film 19 is deposited. Contact holes are formed in the insulating film by pattering and etching of the insulating film such that the contact portions of the n-side electrodes and the contact portions of the p-side electrodes are directly bonded to contact portions of the elements. Then, the formation of electrode wirings which is performed by lift-off and the deposition of the insulating film are repeated several times to form multilayer wirings of the n-side electrodes and the p-side electrodes. Finally, a chip having a desirable shape is cut, and the production of an array chip is completed.

In order to drive a desirable element by time division driving, a resistance between adjacent n-side electrodes is made sufficiently higher than a resistance between p-side and n-side electrodes. In other words, when the resistive layer has a resistance value higher than a resistance value of each of the p-type AlGaAs layer and the n-type AlGaAs layer, a current can be sufficiently prevented from flowing into the metal layers included therein. In this embodiment, the $SiO_2$ film normally serving as an insulator is used as the resistance film and thus has a sufficient high resistance value. In addition to $SiO_2$, for example, a material such as SiN, SiON, AlN, or $Al_2O_3$ can be used.

A film thickness of the $SiO_2$ film is 0.2 µm. When the $SiO_2$ film is too thin, it is likely to leak a current from the element structure side. On the other hand, when the $SiO_2$ film is too thick, this causes an increase in production cost or the increase of light absorption. Therefore, there is an effective thickness range. A desirable thickness is set to 0.05 µm to 0.5 µm. A more desirable thickness is set to 0.1 µm to 0.3 µm.

The light-emitting element arrays according to the first embodiment and the second embodiment as described above are more effective particularly in a case where the element interval is smaller. When the element interval is 40 µm or less, that is, when the resolution is 600 dpi or less, the present invention can be applied.

Even when a conductivity type in the light-emitting element arrays according to the first embodiment and the second embodiment is changed to a reverse conductivity type, that is, even when the n-type is changed to the p-type or even when the p-type is changed to the n-type, the present invention can be applied.

A material for the light-emitting element array according to the present invention is not limited to the AlGaAs material described in the embodiments. In other words, a material used for other light-emitting devices, for example, an AlGaInP-based material or an AlGaInN-based material can be used. Even when such materials are used, a sufficient effect is obtained.

The active layer for the light-emitting element array according to the present invention is not limited to the quantum well active layer described in the embodiments and thus may be, for example, an active layer having an AlGaAs double hetero structure. When the quantum well active layer is used, the light emission efficiency can be improved.

Next, an application example of the light-emitting element array according to the present invention will be described. The light-emitting element array according to the present invention can be used as an exposure light source of an electrophotographic recording system type image forming apparatus. The light-emitting element array can be used as an array light source for other applications.

Figure 9:
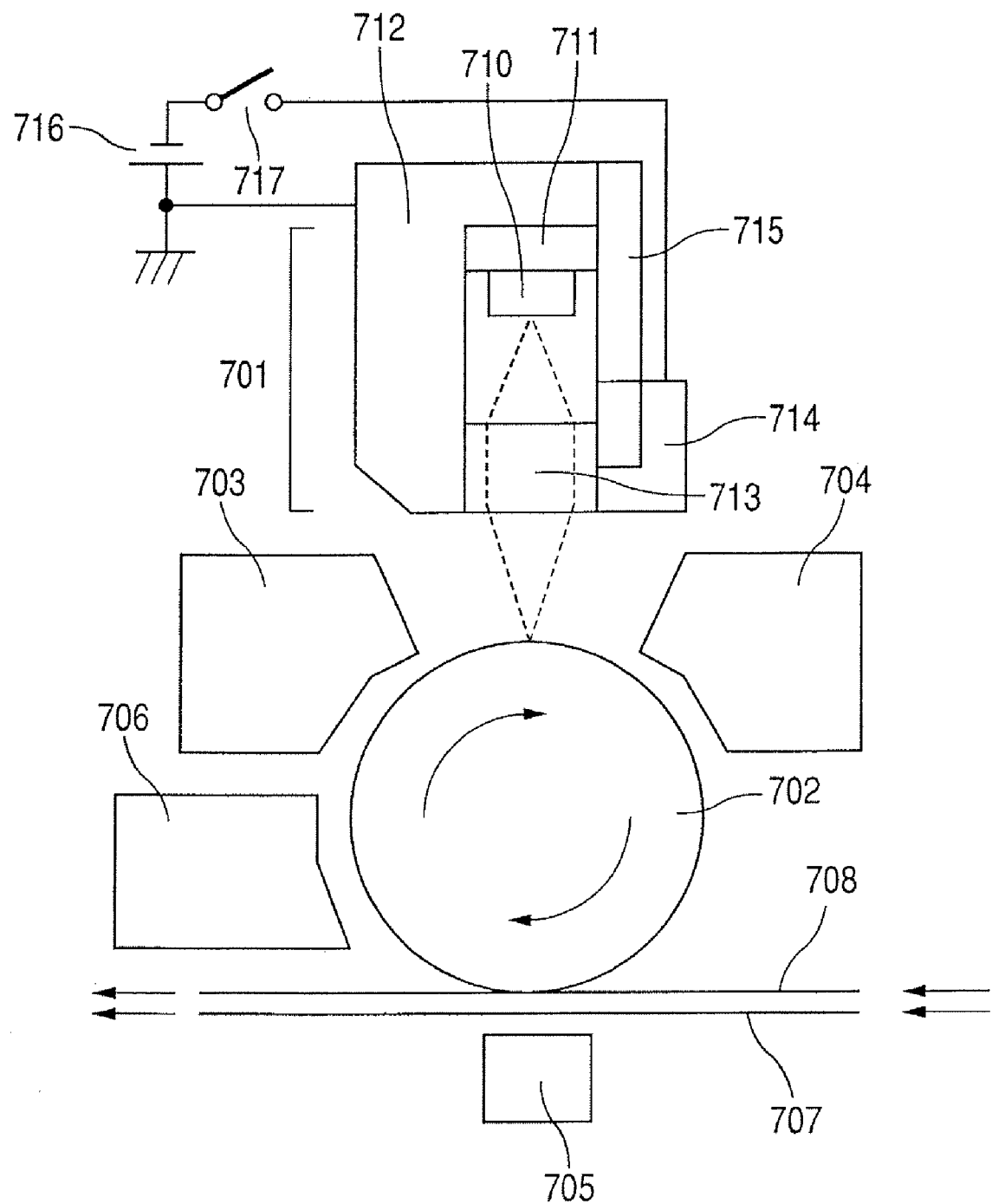
FIG. 9 is a structural diagram illustrating an electrophotographic recording process type image forming apparatus including the light-emitting element array according to the embodiment of the present invention.

FIG. 9 is a structural diagram illustrating an electrophotographic recording system type image forming apparatus including the light-emitting element array according to one of the embodiments.

In FIG. 9, the image forming apparatus includes an exposure portion 701 on which a light-emitting element array semiconductor chip is mounted, a photosensitive drum 702 serving as an opposed light receiving portion, a drum charger 703, a developing device 704 for toner deposition, a transfer device 705 for transferring the toner on the photosensitive drum onto a paper 708 located on a transfer belt 707, and a cleaner 706 for removing residual toner on the photosensitive drum 702 after transfer.

Next, the exposure portion 701 will be described. The exposure portion 701 includes a light-emitting element array semiconductor chip (die) 710, a ceramic base 711 on which a plurality of dice of the light-emitting element array 710 are placed, and an aluminum frame 712 serving as a reference frame for an optical system. The light-emitting element array semiconductor chip 710 may be provided inside the cylindrical photosensitive drum.

The exposure portion 701 further includes: a SELFOC lens array which is a product name (hereinafter merely referred to as "SLA") 713 having focus points on a light emitting point series of the light-emitting element array semiconductor chip 710 and the photosensitive drum 702; and electrodes 714 for generating an electric field for preventing toner from scattering. The exposure portion 701 further includes a mold member 715 for covering/supporting an opposite side of the aluminum frame 712. A power source 716 is used to apply a direct current voltage between the electrodes 714. A switch 717 is used to control the applied direct current voltage.

Next, the flow of image formation on the paper 708 will be described. The photosensitive drum 702 is uniformly negatively charged by the drum charger 703.

Then, the photosensitive drum 702 is exposed corresponding to an image pattern by the exposure portion 701 to positively charge an exposure part, thereby forming an electrostatic latent image. The negatively charged toner is supplied from the developing device 704 to the electrostatic latent image to attract the toner to a positively charged part, thereby forming a toner image on the photosensitive drum 702.

Then, the toner image is transferred onto the paper 708 by the transfer device 705 to form the toner image on the paper 708.

After the transfer, residual toner on the photosensitive drum 702 is removed by the cleaner 706 and then operation returns to a charging process again.

The present invention is used for a light-emitting element array and, an apparatus using the light-emitting element array, for example, an electrophotographic recording system type image forming apparatus including the light-emitting element array.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-219791, filed Aug. 11, 2006, which is hereby incorporated by reference herein in its entirety.

What is claimed is:

1. A light source comprising:
   a substrate;
   a plurality of light-emitting element groups on the substrate, each of the groups including a plurality of light-emitting elements, a first semiconductor member in common, and a plurality of second semiconductor members separated between the plurality of light-emitting elements;
   a metal reflection layer, continuous over the plurality of the light-emitting element groups, provided between the substrate and the first semiconductor member; and
   a resistive layer, provided between the first semiconductor member and the metal reflection layer, for electrical isolation between the light-emitting groups.

2. A light source according to claim 1, wherein the plurality of light-emitting element groups has a plurality of the first semiconductor members with a separation between the groups, respectively.

3. A light source according to claim 1, further comprising a separation groove provided between the adjacent light-emitting element groups, which are electrically separated from each other,
   wherein the separation groove reaches at least the resistive layer.

4. A light source according to claim 1, wherein the resistive layer is made of a semiconductor.

5. A light source according to claim 1, wherein the resistive layer is made of AlGaAs.

6. A light source according to claim 4, wherein the resistive layer is an undoped layer.

7. A light source according to claim 4, wherein the resistive layer is of a p-type and has a doping concentration of a p-type impurity of $1 \times 10^{17}$ cm$^{-3}$ or less.

8. A light source according to claim 4, wherein the resistive layer is of an n-type and has a doping concentration of an n-type impurity of $3 \times 10^{16}$ cm$^{-3}$ or less.

9. A light source according to claim 1, wherein the resistive layer has a thickness of at least 0.1 μm and at most 1 μm.

10. A light source according to claim 1, wherein the resistive layer is made of an insulator.

11. A light source according to claim 1, wherein the resistive layer is made of one selected from the group consisting of $SiO_2$, SiN, SiON, AlN, and $Al_2O_3$.

12. A light source according to claim 10, wherein the resistive layer has a thickness of at least 0.05 μm and at most 0.5 μm.

13. A light source according to claim 1, wherein the light-emitting elements are operated with time division driving.

14. A light source according to claim 1, wherein the light-emitting elements have a light-emitting region at an interval of at most 40 μm.

15. An image forming apparatus comprising:
the light source according to claim 1; and
a photosensitive unit for forming an image by using the light source.

16. A light source according to claim 1, wherein the substrate is a silicon substrate; and
light emission of the light-emitting elements is controlled by time division driving.

17. A light source according to claim 1, wherein the substrate further comprises a control circuit for performing the time division driving.

18. An image forming apparatus comprising:
the light source according to claim 1;
a photosensitive drum for forming an electrostatic latent image using the light source as an exposure portion; and
a developing device for developing the electrostatic latent image formed on the photosensitive drum.

19. An image forming apparatus according to claim 18, wherein the light source is provided inside the photosensitive drum and the photosensitive drum has a cylindrical shape.

20. A light source according to claim 1, wherein the substrate is composed of a silicon member.

21. A light source according to claim 1, wherein the plurality of light-emitting elements is operated with time division driving.

22. A light source comprising:
a substrate;
a plurality of light-emitting element groups on the substrate, each of the groups including a plurality of light-emitting elements, a first semiconductor member in common, a plurality of active members, and a plurality of second semiconductor members separated between the plurality of light-emitting elements;
a compound semiconductor layer, provided between the first semiconductor member and the substrate, for electrical isolation between the light-emitting element groups; and
a metal reflector, continuous over the plurality of the light-emitting element groups, provided between the substrate and the compound semiconductor layer.

23. A light source comprising:
a substrate;
a plurality of light-emitting element groups on the substrate, each of the groups including a plurality of light-emitting elements, a first semiconductor member in common, a plurality of active members, and a plurality of second semiconductor members separated between the plurality of light-emitting elements;
an un-doped compound semiconductor layer, provided between the first semiconductor member and the substrate, for electrical isolation between the light-emitting element groups; and
a metal reflector, continuous over the plurality of the light-emitting element groups, provided between the substrate and the un-doped compound semiconductor layer.

24. A light source comprising:
a substrate;
a plurality of light-emitting element groups on the substrate, each of the groups including a plurality of light-emitting elements, a first semiconductor member in common, a plurality of active members, and a plurality of second semiconductor members separated between the plurality of light-emitting elements;
a p-type doped compound semiconductor layer, with a doping concentration of at most $1 \times 10^{17}$ cm$^{-3}$, provided between the first semiconductor member and the substrate, for electrical isolation between the light-emitting element groups; and
a metal reflector, continuous over the plurality of the light-emitting element groups, provided between the substrate and the p-type doped compound semiconductor layer.

25. A light source comprising:
a substrate;
a plurality of light-emitting element groups on the substrate, each of the groups including a plurality of light-emitting elements, a first semiconductor member in common, a plurality of active members, and a plurality of second semiconductor members separated between the plurality of light-emitting elements;
an n-type doped compound semiconductor layer, with a doping concentration of at most $3 \times 10^{16}$ cm$^{-3}$, provided between the first semiconductor member and the substrate, for electrical isolation between the light-emitting element groups; and
a metal reflector, continuous over the plurality of the light-emitting element groups, provided between the substrate and the n-type doped compound semiconductor layer and composed of a material different from the electrical isolation layer.

26. A light source comprising:
a substrate;
a plurality of light-emitting element groups on the substrate, each of the groups including a plurality of light-emitting elements, a first semiconductor member in common, a plurality of active members, and a plurality of second semiconductor members separated between the plurality of light-emitting elements;
an insulation layer, provided between the first semiconductor member and the substrate, for electrical isolation between the light-emitting element groups; and
a metal reflector, continuous over the plurality of the light-emitting element groups, provided between the substrate and the insulation layer.

* * * * *